(12) United States Patent
Goerlach et al.

(10) Patent No.: US 6,787,905 B1
(45) Date of Patent: Sep. 7, 2004

(54) ELECTRIC SEMICONDUCTOR ELEMENT WITH A CONTACT HOLE

(75) Inventors: Alfred Goerlach, Kusterdingen (DE); Marion Gebhard, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/030,617

(22) PCT Filed: Jul. 3, 2000

(86) PCT No.: PCT/DE00/02113
§ 371 (c)(1),
(2), (4) Date: Jul. 25, 2002

(87) PCT Pub. No.: WO01/03195
PCT Pub. Date: Jan. 11, 2001

(30) Foreign Application Priority Data

Jul. 3, 1999 (DE) .......................................... 199 30 797

(51) Int. Cl.[7] ............................................... H01L 23/28

(52) U.S. Cl. ......................................... 257/751; 257/774

(58) Field of Search .................................. 257/701, 734, 257/751, 774

(56) References Cited

FOREIGN PATENT DOCUMENTS

DE        27 51 667       * 5/1978

* cited by examiner

*Primary Examiner*—Roy Potter
(74) *Attorney, Agent, or Firm*—Kenyon & Kenyon

(57) ABSTRACT

An electric semiconductor component includes a monocrystalline semiconductor substrate made of silicon, for example, an insulation layer arranged on the surface of the semiconductor substrate and penetrated by a contact hole in at least one location and a contact element that contacts the semiconductor substrate through the contact hole and is made of a material in which the semiconductor material of the substrate is soluble in an anisotropic dissolving process. The edges of the contact hole are configured as diffusion stop structures.

9 Claims, 6 Drawing Sheets

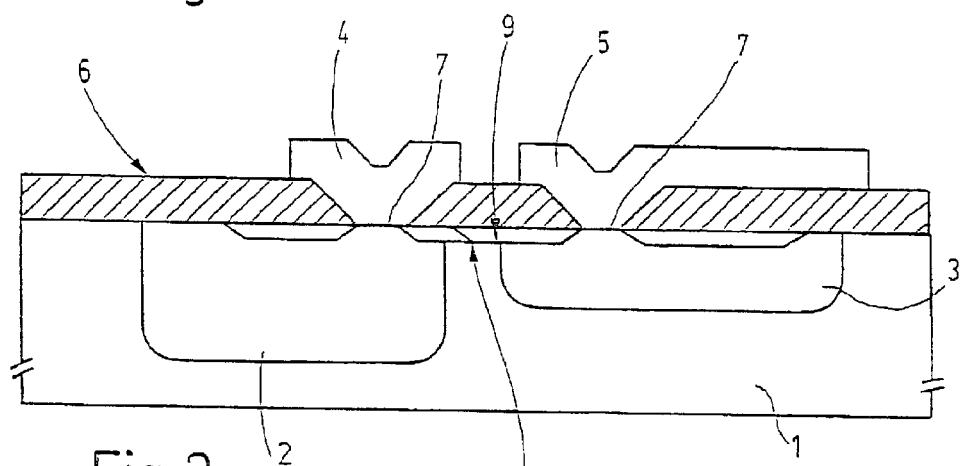
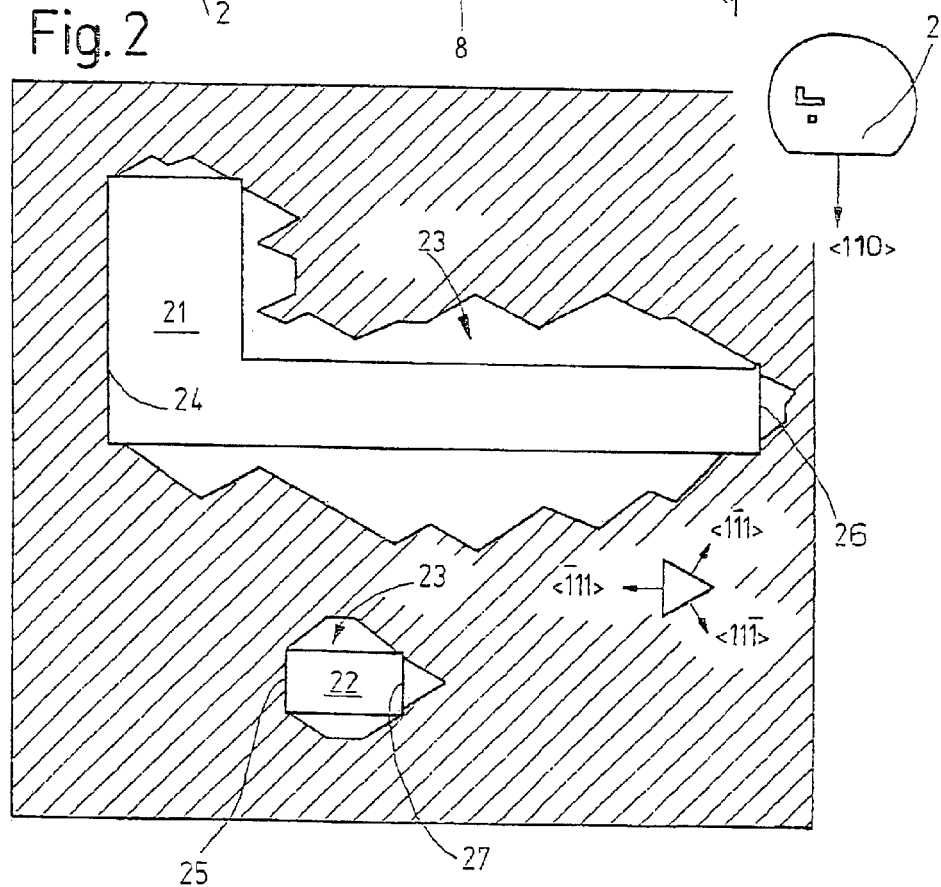

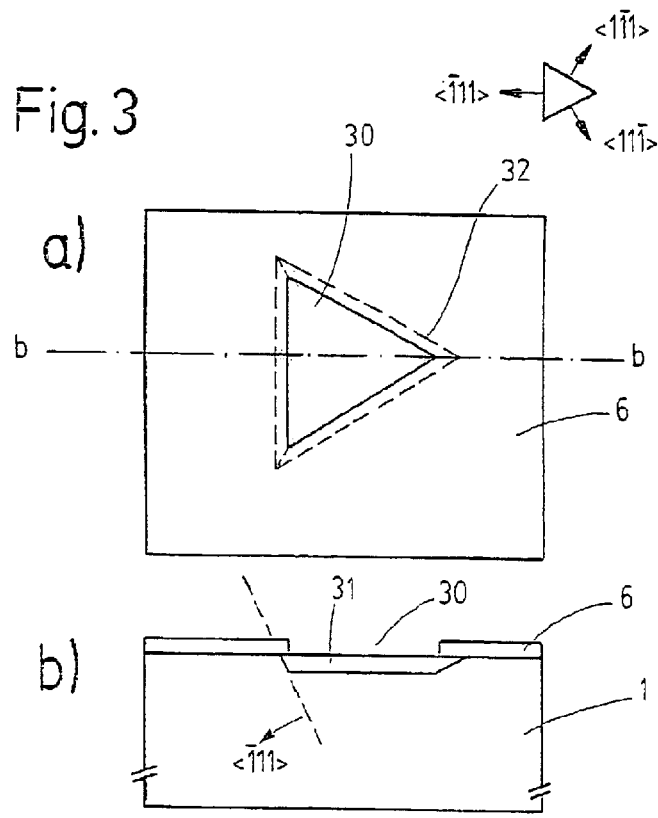
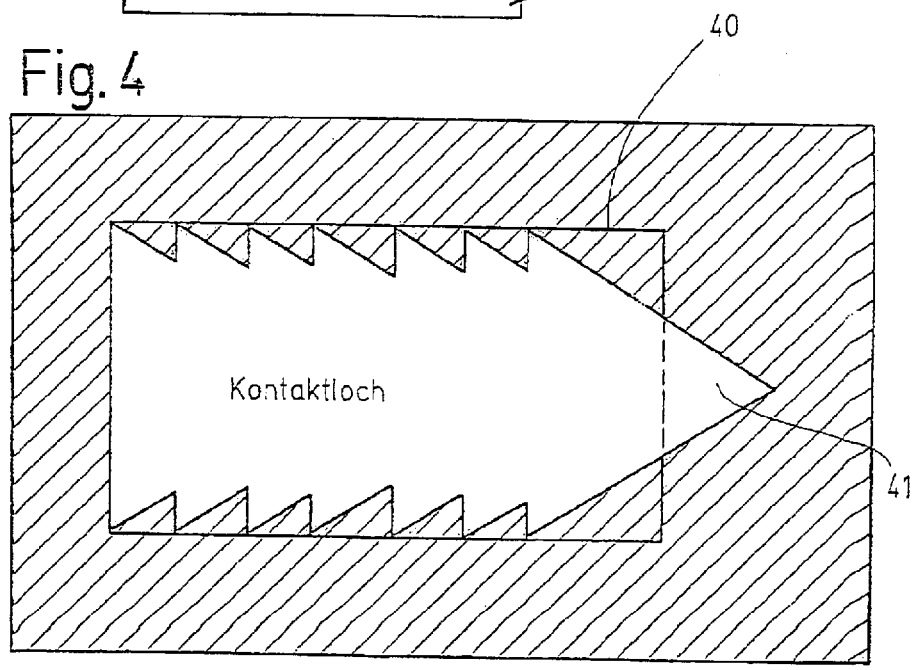

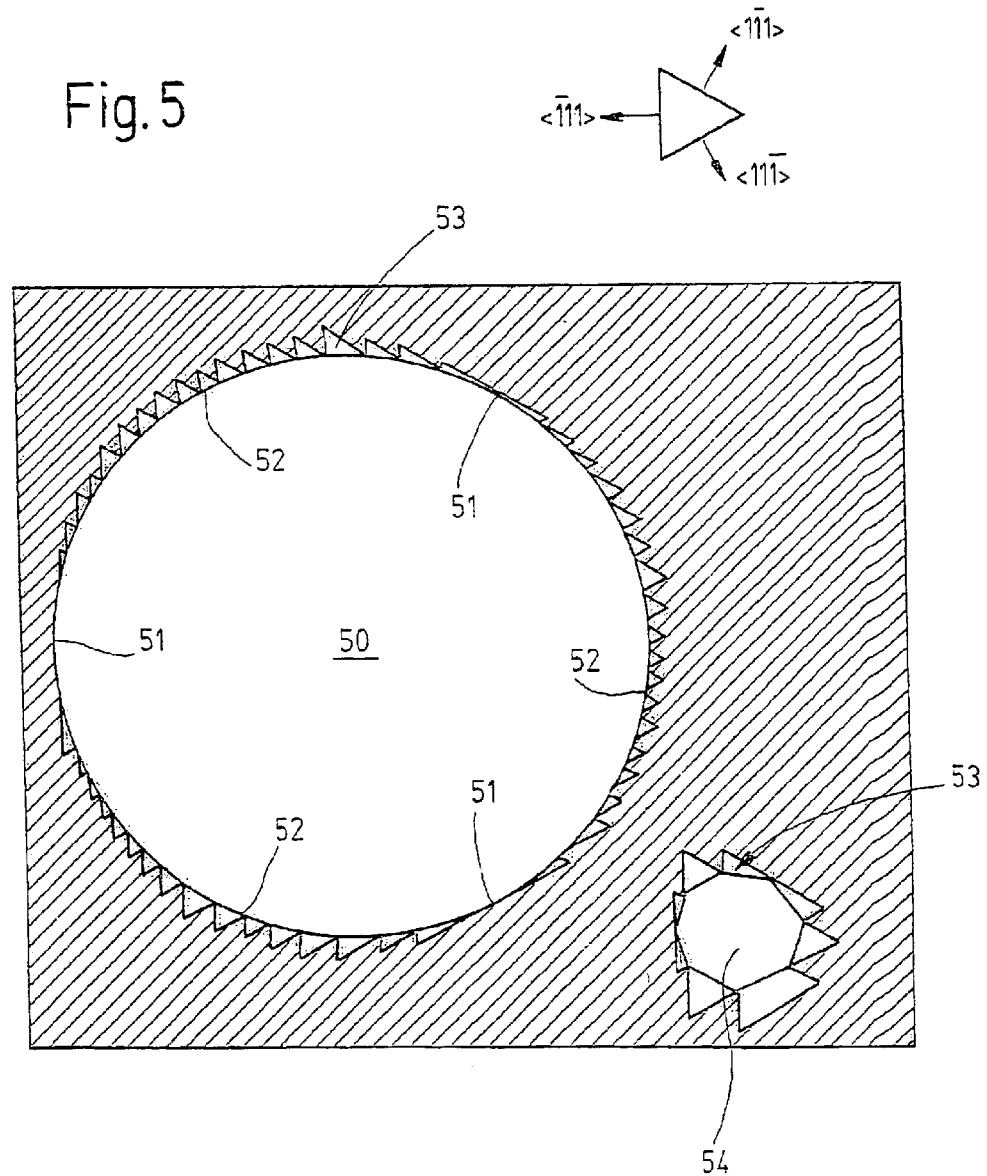

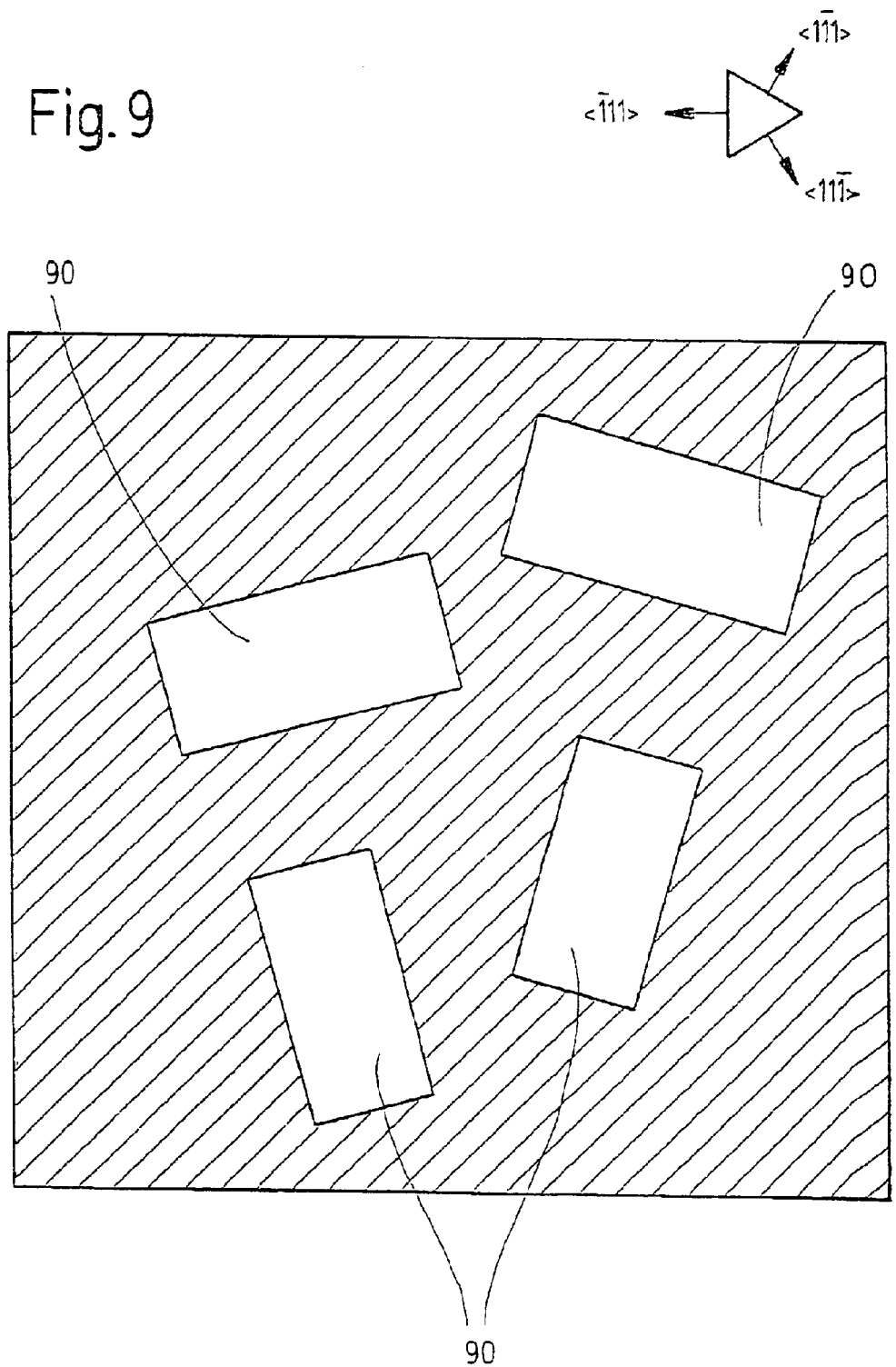

ELECTRIC SEMICONDUCTOR ELEMENT WITH A CONTACT HOLE

FIELD OF THE INVENTION

The present invention relates to an electric semiconductor component including a monocrystalline semiconductor substrate, an insulation layer arranged on the surface of the semiconductor substrate and penetrated by a contact hole in at least one location, and a contact element that contacts the semiconductor substrate through the contact hole and is made of a material in which the semiconductor material of the substrate is soluble in an anisotropic dissolving process.

BACKGROUND INFORMATION

Such semiconductor components in which the semiconductor substrate is silicon and the material of the contact element is aluminum are widely used in general. One problem in establishing contact between aluminum and silicon in the area of the contact holes in such components is the solid-state reaction of aluminum with silicon occurring. For a high conductivity of the contact between the two, it is necessary to remove the oxide film which is naturally present between aluminum and silicon in the contact hole. This is accomplished by a temperature treatment in the range of 300° C. to 500° C. At these temperatures, metallurgical reactions of aluminum with silicon occur due to the solid-state solubility of each substance in the other at locations where the oxide has been removed. The solubility of silicon in aluminum is on the order of a few percent (e.g., 0.48% at T=450° C.), depending on the temperature. The diffusion of silicon in polycrystalline aluminum is very high because of accelerated diffusion along grain boundaries. Therefore, in the course of the temperature treatment, not only is the direct contact hole area saturated with silicon, but also the adjacent aluminum conductor regions become saturated with silicon. Depending on the temperature, a large quantity of silicon may be dissolved away from the surface of the semiconductor component and may migrate into the aluminum contact structure. In a temperature treatment at 450° C. for three minutes, for example, the diffusion length of the silicon atoms amounts to approximately 40 $\mu$m. The silicon atoms dissolved out of the crystal are replaced by aluminum atoms migrating out of the contact structure. They form "spikes", which are deposits of aluminum having a silicon content. The dimensions of these spikes become larger as the size of the contact hole becomes smaller and the volume of aluminum to be saturated in relation to it becomes larger. These spikes may greatly distort electric fields in the area of the contact hole or may lead to total failure of the component if they extend to a pn junction of the component.

To avoid this problem, it is described D. H. Widmann, H. Mader, H. Friedrich, *Technologie hochintegrierter Schaltungen* [*Technology of Highly Integrated Circuits*], Berlin, Springer 1996, for example, that silicon-doped aluminum may be used as the material for the contact structures of electronic components. The silicon concentration of the doped aluminum is greater than the solid-state solubility of silicon in aluminum, based on the highest process temperatures reached in the temperature treatment. This concentration may be approximately 1% silicon.

However, this method cannot be used for contacting in contact holes on high-resistance n-type silicon (donor concentration less than $10^{20}$ cm$^{-3}$). Epitaxial silicon deposits are formed in the contact hole area on cooling. These silicon deposits are doped with aluminum and therefore are p-conducting. Because of the formation of the pn junction, they have a negative effect on the contact resistance with increasing degrees of coverage in the contact hole. Therefore, aluminum without added silicon as the metallic coating is used for contacting high-resistance n-type silicon. To produce a conductive junction in the contact hole, the occurrence of spikes must be accepted.

SUMMARY

An object of the present invention is to limit the formation of spikes in a contact hole of a semiconductor component to a great extent by the configuration of the edges of the contact hole. It is not necessary to add additional structures, foreign substances, etc.

There are various configuration possibilities for the edges, which are referred to as diffusion stop structures. Curved segments are the first possibility. For example, a contact hole may be circular as a whole, or it may be composed of overlapping intersecting circles. The effect of the circular segment is based on the fact that it is composed of a plurality of linear segments, each having different directional indices, based on crystalline size dimensions, and that the dissolving process progresses differently along the individual linear segments until reaching the respective areas in the crystalline interior that present the greatest resistance to the dissolving process. The smaller the radius of such a circle, the shorter the corresponding linear segments and also the smaller the spikes that may emanate from a single linear segment.

A similar effect is achieved when the conventional straight bordering lines of a contact hole are replaced by microstructured sections. These microstructured sections may have a crenellated or sawtooth pattern, for example. The dissolving process proceeds regularly from a linear segment of the edge and progresses until reaching sparingly soluble crystal planes. Microstructuring achieves the result that the individual fronts where the dissolving process occurs are shortened in comparison with a rectilinear edge, and that accordingly only a smaller volume of the semiconductor material may be dissolved before reaching planes of the crystal that dissolve only slowly or not at all. The resulting spikes may be shorter as the microstructure becomes finer. An edge length of the structure elements may be 2 $\mu$m or less.

However, it is also possible to prevent or at least largely suppress the development of spikes on rectilinear edges of the contact holes. The anisotropy of the dissolving process implies that the semiconductor material has at least one class of crystal planes that are subject to little or no attack in the dissolving process. A class is understood to refer to a family of crystal planes the Miller's indices of which arise from one another through permutation and/or sign reversal. All the planes of such a class are equivalent from a crystallographic standpoint. Rectilinear sections of the edges of a contact hole may be arranged so that they intersect such crystal planes of the class extending beneath the contact hole in the semiconductor substrate.

A contact hole may also be configured so that all its edges fulfill the above-mentioned requirement. Such a contact hole may be in the form of an equilateral triangle or overlapping, intersecting equilateral triangles.

The substrate of the semiconductor component may be a <111> silicon substrate because the <111>plane of silicon is hardly subject to attack by dissolving in aluminum.

It is also possible to restrict the formation of spikes on such a substrate by the contact hole having edges that are rotated by ±15° toward the lines of intersection of the <11$\bar{1}$> plane, the <1$\bar{1}$1> plane or the <$\bar{1}$11> plane with the surface.

BRIEF DESCRIPTION OF THE DRAWINGS

FIG. 1 is a cross-sectional view of a conventional semiconductor component illustrating the problem of spike formation.

FIG. 2 illustrates a surface of a semiconductor substrate having spikes formed at the edge of two contact holes.

FIG. 3 is a top view and a sectional view of a semiconductor surface including a contact hole according to an example embodiment of the present invention.

FIG. 4 illustrates a variant of the contact hole illustrated in FIG. 3.

FIG. 5 illustrates a semiconductor surface having two circular holes according to an example embodiment of the present invention.

FIG. 9 illustrates a semiconductor surface having edges protected from the formation of spikes due to their orientation relative to planes that are sparingly soluble.

DETAILED DESCRIPTION

Figure 6:
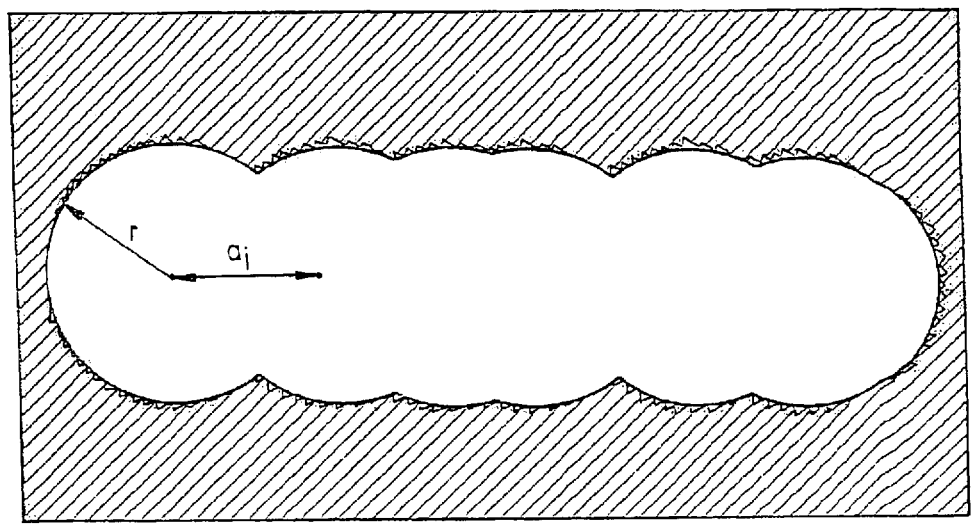
FIG. 6 illustrates a variant of the contact holes illustrated in FIG. 5.

To illustrate the problem with spikes, FIG. 1 is a cross-sectional view through an electronic component including a high-resistance semiconductor substrate 1 and two doped regions 2, 3 formed in it, which are to be separated from one another with a high resistance. An insulation layer 6, which is applied to the surface of the substrate, includes two contact windows 7 through which doped regions 2, 3 are each connected to a contact element 4, 5 made of aluminum of the contact structure. There should not be a conducting connection between contact elements 4, 5. However, during a temperature treatment, which is necessary to produce a satisfactory electric contact between the doped regions and the contact elements, aluminum diffuses out of contact elements 4, 5 and into semiconductor substrate 1. Since the surface of semiconductor substrate 1 has a <111> orientation, the aluminum is not able to penetrate far into the depth of the substrate and therefore has spread out parallel to the surface, and spikes 8, 9 have been formed starting from the various contact holes, establishing a conducting junction between regions 2, 3. Therefore, this component is not usable.

FIG. 2 illustrates an enlarged detail of a surface of a silicon <111> wafer 20 including two contact holes 21, 22. FIG. 2 does not illustrate the insulation layer at the surface of the wafer, but only shows the insulation layer at the edges of contact holes 21, 22 formed therein. A directional graphic illustrates projections of the <11$\bar{1}$>, <1$\bar{1}$1> and <$\bar{1}$11> directions onto the plane of FIG. 2. The edges of contact holes 21, 22 which are horizontal in FIG. 2 are parallel to a <110>-oriented flat of wafer 20. The vertical edges of contact holes 21, 22 at the left of FIG. 2 show almost no spikes, and the original silicon crystal indicated with hatching extends directly to these edges. At all the other edges, spikes 23 extend far above the original edges of the contact holes to the substrate surface. The reason for this is the orientation of the edges relative to the crystal planes belonging to the same class as the surface. The vertical edges thus extend parallel to the lines of intersection of a crystal face of this class, which may be arbitrarily designated as the <−111> plane. This plane intersects left vertical edges 24, 25 of the two contact holes in an orientation such that it extends beneath the contact holes within the substrate. When in a tempering treatment, an interface between silicon and aluminum propagates slowly perpendicular to the <111> surface of the other substrate into the depth of the substrate, and a <−111>- oriented interface develops immediately at edges 24, 25 and may also propagate only slowly into the interior of the substrate. However, <100> interfaces, which present only a low resistance to the dissolving process, are formed at right vertical edges 26, 27, so that spikes 23 are able to propagate there, as well as at the horizontal edges.

FIG. 3 illustrates a contact hole of a semiconductor component according to a first example embodiment of the present invention, FIG. 3a illustrates the contact hole in a top view, and FIG. 3b illustrates it in a section along the dash-dot line b—b illustrated in FIG. 3a. The semiconductor substrate is a silicon substrate having a <111> surface. Contact hole 30 develops in the form of an equilateral triangle in an insulation layer 6 on the surface of substrate 1. As indicated by the directional graphic, all three sides extend parallel to the lines of intersection of the surface with crystal planes of the <111> class. The crystal planes extend through semiconductor substrate 1 beneath the contact hole, as illustrated in FIG. 3b on the basis of the example of the <$\bar{1}$11> plane. Region 3b in FIG. 3b illustrates a zone in which the silicon of semiconductor substrate 1 has penetrated into substrate 1 due to a tempering treatment of a contact made of aluminum attached in contact hole 30. All the interfaces between zone 31 and substrate 1 are class <111> crystal planes. The lateral propagation of zone 31 over the edges of contact hole 30 is correspondingly small. This propagation is indicated by dotted triangle 32 illustrated in FIG. 3a.

It is not crucial for the present invention that contact hole 30 is an exact triangle with acute corners. The corners may also be truncated or rounded, and in this case, interfaces between zone 31 containing aluminum and silicon substrate 1 that do not belong to class <111> may first be formed on them, unlike the case of a triangle having acute corners, but the final shape that may be achieved by the zone containing aluminum in such a case may correspond to that of triangle 32.

Rectangular contact holes having unequal edge lengths may be desired for contacting semiconductor substrates. FIG. 4 illustrates on the basis of a top view of a silicon <111> substrate having the same orientation as that illustrated in FIG. 3, how such a rectangular contact hole indicated by line 40 may be approximated by a plurality of overlapping mutually intersecting equilateral triangles. This yields an elongated contact hole 41 the edges of which form a sawtooth pattern in some areas and in this manner fulfill the requirement at all points that they may intersect crystal planes of class <111> extending beneath the contact hole in the interior of the substrate.

FIG. 5 is a top view of a circular contact hole 50 on a silicon <111> surface which has exactly the same orientation as that illustrated in FIGS. 3 and 4. The edge of the contact hole includes three regions 51 that at least approximately fulfill the same condition with regard to their orientation as the edges of the contact holes illustrated in FIGS. 3 and 4. Accordingly, practically no spikes develop in these regions. In edge areas 52 in between, there are a great many spikes 53, but all of them have only a slight lateral extent. The reason for this is that the circular shape of contact hole 50, based on the size dimension of the crystal lattice, may be regarded as a result of many individual linear segments having different orientations and therefore resisting the dissolving attack of aluminum to different extents, and there is a plurality of lattice sites, e.g., at steps or corners of the interface between the silicon crystal and aluminum, which may function as a seed for the formation of spikes because of their emphasized coordination, or may prevent the propagation of spikes. Therefore, the process of dissolving silicon in aluminum proceeds from a plurality of points in close proximity to one another along the edge and progresses radially outwardly from there, and the crystal fades of the <111> class, which are not as susceptible to attack, remain. As soon as two spikes have become so deep that their bordering faces are in contact, the dissolving process may stop.

The circular shape of contact hole 50 may be as accurate as possible. For comparison purposes, a second smaller contact hole 54, which is only approximately circular, is also illustrated in FIG. 5, its edge being made up of a small number of linear segments. Each linear segment forms the starting point for a spike 53, and since the linear segments are relatively long in comparison with contact hole 50, relatively larger spikes are also formed here.

FIG. 6 illustrates a rectangular contact hole that may be approximated by overlapping, intersecting circular contact holes, each having identical diameters r and spacings $a_i$.

Figure 7:
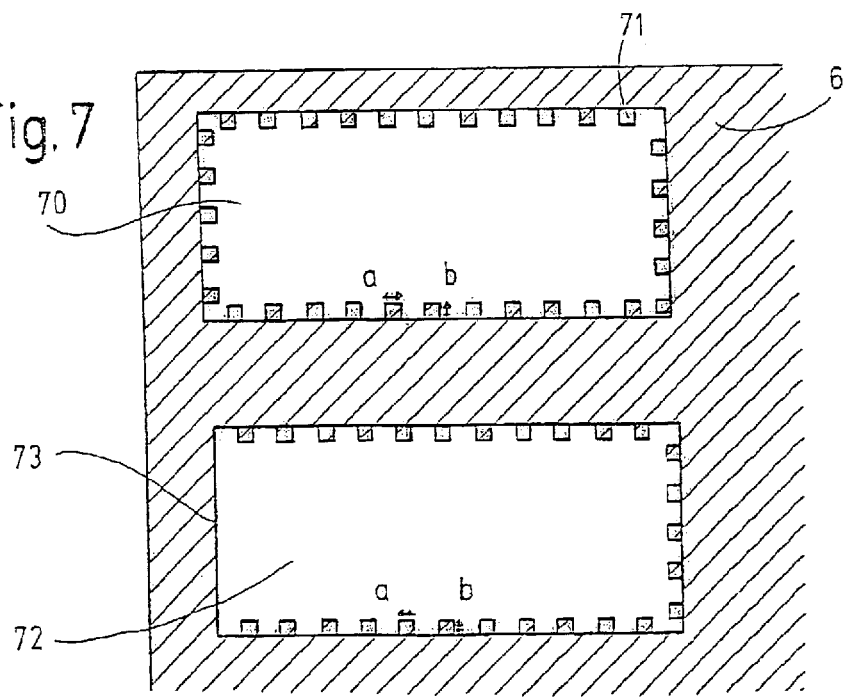
FIG. 7 illustrates a semiconductor surface having two contact holes with microstructured edges according to an example embodiment of the present invention.

FIG. 7 illustrates other example variants of contact holes that are based on the finding that it is appropriate to avoid long, straight edge sections in order to limit propagation of the spikes. Therefore, in the case of contact hole 70, all the edges are crenellated, with small rectangular projections 71 of insulation layer 6 meshing into the interior of the contact hole. Projections 71 have a dimension a parallel to the edge and a dimension b perpendicular to that in the order of 2 $\mu$m or less. The period of the crenelation may be 4 $\mu$m, for example.

As illustrated with respect to contact hole 72, these projections 71 may be omitted on an edge 73, the orientation of which meets the condition defined for the edges of the triangle illustrated in FIG. 3.

Figure 8:
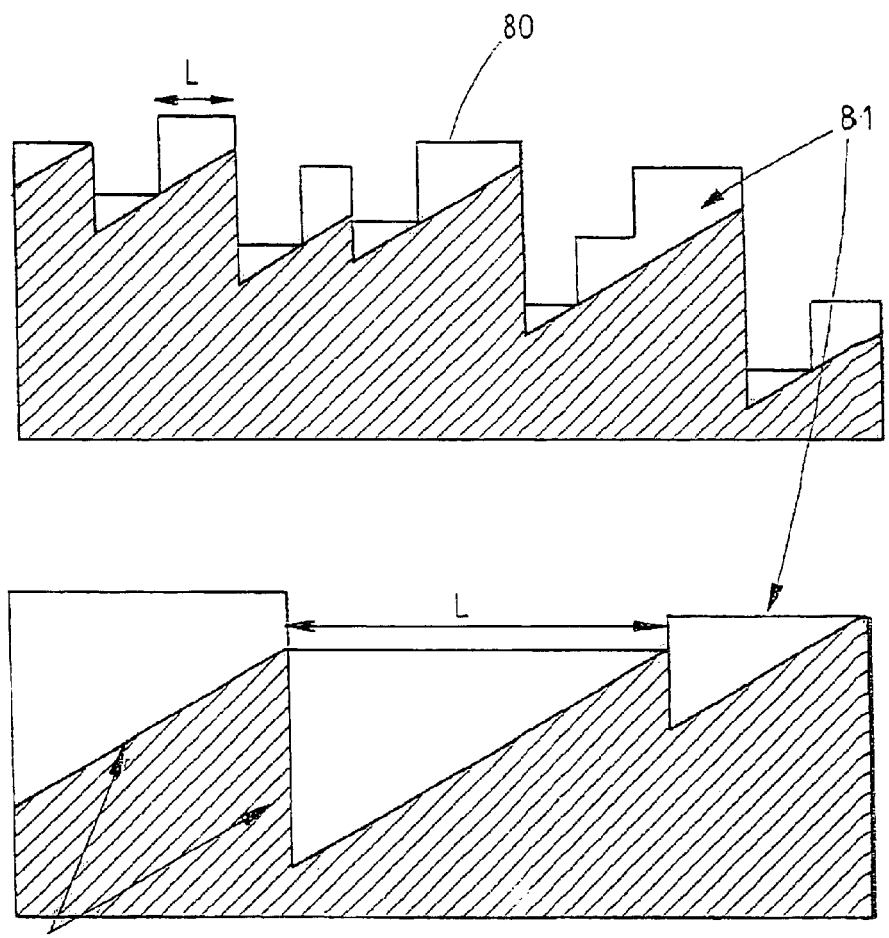
FIG. 8 illustrates two microstructured edges of a contact hole after a temperature treatment.

The effect of projections 71 is illustrated on the basis of FIG. 8. The orientation of the semiconductor substrate, more specifically, that of its planes of class <111>, is the same in FIG. 8 as in FIGS. 2 to 7. FIG. 8 illustrates the pattern of an edge 80 of a contact element as a solid line.

The edge is richly structured in a plurality of sections, intersecting one another at right angles. During tempering of the component, spikes 81 form along edge 80 and extend beneath the insulation layer until they are only surrounded by interfaces of class <111> that may be difficult to attack. As illustrated by the comparison of the two edge patterns illustrated in FIG. 8, these spikes are more numerous and smaller, the finer the structure of the edge.

FIG. 9 is a top view of a semiconductor substrate including a plurality of rectangular contact holes 90. The orientation of the semiconductor substrate is the same as that illustrated in the preceding Figures. The edges of the contact holes are rotated by ±15° in one of these three directions. This may be the greatest angular deviation from one of the three directions that is possible on a surface having trigonal symmetry like the <111> surface of silicon. This orientation may guarantee a plurality of exposed points along each edge, from which spikes may form or which prevent the propagation of spikes. Therefore, in tempering the substrate, a large number and density of spikes are formed with aluminum contact elements attached in contact holes 90, but the growth of these spikes may stop in the course of the tempering process as soon as the sparingly soluble interfaces of the spikes begin to come in contact with one another.

Advantages of various embodiments of the present invention have been described above with respect to a silicon <111> surface and aluminum as the material at the contact elements. It is also possible to apply the present invention to other surfaces, in which case the spikes may then possibly extend into the depth of a substrate rather than parallel to the surface, as well as other combinations of semiconductor material and metal. The semiconductor material may have an anisotropic solubility characteristic with respect to the metal.

What is claimed is:
1. An electric semiconductor component, comprising:
a monocrystalline semiconductor substrate;
an insulation layer arranged on a surface of the semiconductor substrate and penetrated by at least one contact hole in at least one location; and
a contact structure that contacts the semiconductor substrate through the contact hole and made of a material in which a semiconductor material of the semiconductor substrate is soluble in an anisotropic dissolving process;
wherein edges of the contact hole include diffusion stop structures, and wherein the diffusion stop structures include curved segments.

2. The semiconductor component according to claim 1, wherein the contact hole is shaped one of circular and as overlapping intersecting circles.

3. The semiconductor component according to claim 1, wherein the semiconductor material includes at least one class of crystal planes that is subject to one of little and no attack in the dissolving process, and the diffusion stop structures include rectilinear sections of the edges intersecting the crystal planes of the class of crystal planes extending in the semiconductor substrate beneath the contact hole.

4. The semiconductor component according to claim 1, wherein the semiconductor substrate includes a <111> Si substrate.

5. The semiconductor component according to claim 4, wherein the edges of the contact hole are rotated by approximately ±15° toward lines of intersection of one of the <11$\bar{1}$>, <1$\bar{1}$1> and <$\bar{1}$11> crystal planes with the surface.

6. An electric semiconductor component, comprising:
a monocrystalline semiconductor substrate;
an insulation layer arranged on a surface of the semiconductor substrate and penetrated by at least one contact hole in at least one location; and
a contact structure that contacts the semiconductor substrate through the contact hole and made of a material in which a semiconductor material of the semiconductor substrate is soluble in an anisotropic dissolving process;
wherein edges of the contact hole include diffusion stop structures, and wherein the diffusion stop structures include microstructured sections of the edges.

7. The semiconductor component according to claim 6, wherein the microstructured sections include one of a crenellated and a sawtooth pattern.

8. The semiconductor component according to claim 7, wherein the one of the crenellated and the sawtooth pattern includes a plurality of projections, each projection having an edge length of at most 2 $\mu$m.

9. An electric semiconductor component, comprising:

a monocrystalline semiconductor substrate;

an insulation layer arranged on a surface of the semiconductor substrate and penetrated by at least one contact hole in at least one location; and a contact structure that contacts the semiconductor substrate through the contact hole and made of a material in which a semiconductor material of the semiconductor substrate is soluble in an anisotropic dissolving process;

wherein edges of the contact hole include diffusion stop structures, and wherein the contact hole is shaped as one of an equilateral triangle and overlapping, intersecting equilateral triangles.

* * * * *